United States Patent
Suh et al.

(10) Patent No.: US 7,601,567 B2
(45) Date of Patent: Oct. 13, 2009

(54) METHOD OF PREPARING ORGANIC THIN FILM TRANSISTOR, ORGANIC THIN FILM TRANSISTOR, AND ORGANIC LIGHT-EMITTING DISPLAY DEVICE INCLUDING THE ORGANIC THIN FILM TRANSISTOR

(75) Inventors: Min-Chul Suh, Suwon-si (KR); Taek Ahn, Suwon-si (KR); Jin-Seong Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 205 days.

(21) Appl. No.: 11/637,997

(22) Filed: Dec. 12, 2006

(65) Prior Publication Data

US 2007/0134857 A1     Jun. 14, 2007

(30) Foreign Application Priority Data

Dec. 13, 2005    (KR) ...................... 10-2005-0122584
Dec. 7, 2006     (KR) ...................... 10-2006-0124109

(51) Int. Cl.
    *H01L 21/00*      (2006.01)
(52) U.S. Cl. .................. 438/149; 438/778; 438/99; 438/151; 438/790; 257/40; 257/66; 257/194; 257/E29
(58) Field of Classification Search .................. 438/149
See application file for complete search history.

(56) References Cited

U.S. PATENT DOCUMENTS 5,284,779 A *   2/1994   Miyanaga ..................... 117/84

(Continued)

FOREIGN PATENT DOCUMENTS

KR    10-2000-0062886 A    10/2000

(Continued)

OTHER PUBLICATIONS

Korean Office Action issued Apr. 18, 2008 in counterpart Korean Patent Application No. 10-2006-0124109.

(Continued)

*Primary Examiner*—N Drew Richards
*Assistant Examiner*—Ankush K Singal
(74) *Attorney, Agent, or Firm*—Knobbe Martens Olson & Bear LLP

(57) ABSTRACT

A method of forming an organic thin film transistor is disclosed. The method includes forming source and drain electrodes on a substrate; forming an insulating layer covering the source and drain electrodes; first surface-treating the insulating layer so that the insulating layer has a hydrophobic surface; forming an opening that exposes facing portions of the source and drain electrodes in the first surface-treated insulating layer; forming an organic semiconductor layer and a gate insulating layer in the opening; second surface-treating the first surface-treated insulating layer so that the insulating layer has a hydrophilic surface; and forming a gate electrode overlapping at least a portion of the source and drain electrodes, an organic thin film transistor, and a flat panel display device including the organic thin film transistor. According to the method of preparing an organic thin film transistor as described above, at least one of an organic semiconductor layer and a gate insulating layer can be easily formed. When the organic thin film transistor is formed in an array form with respect to a capacitor, the organic thin film transistor has a substantially low parasitic capacitance and the capacitor has a high capacitance.

20 Claims, 12 Drawing Sheets

U.S. PATENT DOCUMENTS

| | | | |
|---|---|---|---|
| 5,706,064 A * | 1/1998 | Fukunaga et al. | 349/43 |
| 5,759,906 A * | 6/1998 | Lou | 438/623 |
| 5,796,121 A * | 8/1998 | Gates | 257/59 |
| 5,822,170 A * | 10/1998 | Cabuz et al. | 361/225 |
| 5,856,409 A * | 1/1999 | Ziemelis et al. | 525/330.2 |
| 6,045,710 A * | 4/2000 | Silverbrook | 216/2 |
| 6,048,573 A * | 4/2000 | Tang et al. | 427/66 |
| 6,066,357 A * | 5/2000 | Tang et al. | 427/66 |
| 6,140,668 A * | 10/2000 | Mei et al. | 257/66 |
| 6,194,837 B1 * | 2/2001 | Ozawa | 315/169.1 |
| 6,297,589 B1 * | 10/2001 | Miyaguchi et al. | 313/504 |
| 6,416,159 B1 * | 7/2002 | Floyd et al. | 347/21 |
| 6,495,478 B1 * | 12/2002 | Jang | 438/781 |
| 6,558,992 B2 * | 5/2003 | Wong | 438/151 |
| 6,580,212 B2 * | 6/2003 | Friend | 313/504 |
| 6,633,121 B2 * | 10/2003 | Eida et al. | 313/504 |
| 6,656,611 B2 * | 12/2003 | Tai et al. | 428/690 |
| 6,689,632 B2 * | 2/2004 | Kim et al. | 438/29 |
| 6,777,170 B1 * | 8/2004 | Bloomstein et al. | 430/320 |
| 6,800,546 B2 * | 10/2004 | Konishi et al. | 438/623 |
| 6,856,361 B2 * | 2/2005 | Kim et al. | 349/43 |
| 6,965,480 B2 * | 11/2005 | Kroupenkine | 359/665 |
| 7,067,841 B2 * | 6/2006 | Parker | 257/40 |
| 7,102,280 B1 * | 9/2006 | Duineveld et al. | 313/504 |
| 7,196,015 B2 * | 3/2007 | Chae et al. | 438/706 |
| 7,199,515 B2 * | 4/2007 | Seo et al. | 313/504 |
| 7,199,516 B2 * | 4/2007 | Seo et al. | 313/504 |
| 7,220,682 B2 * | 5/2007 | Hirai | 438/763 |
| 7,232,754 B2 * | 6/2007 | Kirby et al. | 438/667 |
| 7,285,910 B2 * | 10/2007 | Park et al. | 313/506 |
| 7,300,861 B2 * | 11/2007 | Arias | 438/597 |
| 7,307,381 B2 * | 12/2007 | Ito et al. | 313/506 |
| 7,396,699 B2 * | 7/2008 | Campbell et al. | 438/95 |
| 2002/0054268 A1 * | 5/2002 | Kim et al. | 349/158 |
| 2002/0150683 A1 * | 10/2002 | Troian et al. | 427/256 |
| 2002/0182845 A1 * | 12/2002 | Miyano et al. | 438/618 |
| 2003/0060038 A1 * | 3/2003 | Sirringhaus et al. | 438/637 |
| 2003/0098645 A1 * | 5/2003 | Lee et al. | 313/504 |
| 2003/0143339 A1 * | 7/2003 | Kobayashi | 427/558 |
| 2003/0157244 A1 * | 8/2003 | Kawase | 427/58 |
| 2003/0194709 A1 * | 10/2003 | Yang | 435/6 |
| 2003/0214620 A1 * | 11/2003 | Kim et al. | 349/155 |
| 2003/0218419 A1 * | 11/2003 | Bae | 313/504 |
| 2004/0023447 A1 * | 2/2004 | Hirakata et al. | 438/149 |
| 2004/0129978 A1 * | 7/2004 | Hirai | 257/347 |
| 2004/0132314 A1 * | 7/2004 | Decre et al. | 438/761 |
| 2004/0135497 A1 * | 7/2004 | Kim et al. | 313/504 |
| 2004/0214381 A1 * | 10/2004 | Ohta | 438/197 |
| 2005/0032268 A1 * | 2/2005 | Nishikawa et al. | 438/99 |
| 2005/0057152 A1 * | 3/2005 | Park | 313/506 |
| 2005/0079647 A1 * | 4/2005 | Abraham et al. | 438/48 |
| 2005/0085097 A1 * | 4/2005 | Kaji et al. | 438/778 |
| 2005/0145839 A1 * | 7/2005 | Yamamoto et al. | 257/40 |
| 2005/0202348 A1 * | 9/2005 | Nakayama et al. | 430/311 |
| 2005/0250260 A1 * | 11/2005 | Hayase et al. | 438/149 |
| 2005/0279999 A1 * | 12/2005 | Lee et al. | 257/66 |
| 2006/0110606 A1 * | 5/2006 | Luten | 428/432 |
| 2006/0119259 A1 * | 6/2006 | Bae et al. | 313/506 |
| 2006/0127563 A1 * | 6/2006 | Toyoda et al. | 427/58 |
| 2006/0148167 A1 * | 7/2006 | Brown et al. | 438/232 |
| 2006/0160277 A1 * | 7/2006 | Sirringhaus et al. | 438/149 |
| 2006/0170338 A1 * | 8/2006 | Masuichi et al. | 313/504 |
| 2006/0172091 A1 * | 8/2006 | Tung et al. | 428/1.32 |
| 2006/0202202 A1 * | 9/2006 | Denda et al. | 257/59 |
| 2006/0220543 A1 * | 10/2006 | Makiura | 313/506 |
| 2006/0227268 A1 * | 10/2006 | Yoon | 349/129 |
| 2006/0256247 A1 * | 11/2006 | Hirai et al. | 349/42 |
| 2006/0286726 A1 * | 12/2006 | Sirringhaus et al. | 438/151 |
| 2007/0007515 A1 * | 1/2007 | Suh et al. | 257/40 |
| 2007/0012950 A1 * | 1/2007 | Cain et al. | 257/194 |
| 2007/0040169 A1 * | 2/2007 | Kim et al. | 257/40 |
| 2007/0085076 A1 * | 4/2007 | Yamamoto et al. | 257/40 |
| 2007/0090092 A1 * | 4/2007 | Forstner et al. | 216/67 |
| 2007/0090362 A1 * | 4/2007 | Ahn et al. | 257/66 |
| 2007/0096079 A1 * | 5/2007 | Nakayama et al. | 257/40 |
| 2007/0128416 A1 * | 6/2007 | Takahashi et al. | 428/195.1 |
| 2007/0134832 A1 * | 6/2007 | Oh et al. | 438/30 |
| 2007/0161163 A1 * | 7/2007 | Hirai | 438/149 |
| 2007/0184996 A1 * | 8/2007 | Weng et al. | 510/175 |
| 2008/0026499 A1 * | 1/2008 | Moriya et al. | 438/30 |
| 2008/0029833 A1 * | 2/2008 | Li | 257/410 |
| 2008/0079359 A1 * | 4/2008 | Sakakura et al. | 313/504 |

FOREIGN PATENT DOCUMENTS

KR  10-2003-0092314 A  12/2003

OTHER PUBLICATIONS

Korean Notice of Allowance issued Aug. 29, 2008 in corresponding Korean Patent Application No. 10-2006-0124109.

* cited by examiner

METHOD OF PREPARING ORGANIC THIN FILM TRANSISTOR, ORGANIC THIN FILM TRANSISTOR, AND ORGANIC LIGHT-EMITTING DISPLAY DEVICE INCLUDING THE ORGANIC THIN FILM TRANSISTOR

CROSS-REFERENCE TO RELATED APPLICATIONS

This application claims the benefit of Korean Patent Application No. 10-2005-0122584, filed on Dec. 13, 2005, and Korean Patent Application No. 10-2006-0124109, filed on Dec. 7, 2006, in the Korean Intellectual Property Office, the disclosures of which are incorporated herein in its entirety by reference.

BACKGROUND

1. Field

The instant disclosure relates to a method of preparing an organic thin film transistor, an organic thin film transistor, and an organic light-emitting display device including the organic thin film transistor, and more particularly, to a method of preparing an organic thin film transistor in which before an opening is formed in an insulating layer, the insulating layer is treated with plasma so that the insulating layer has a hydrophobic surface and thus an organic semiconductor layer and a gate insulating layer are precisely formed, the organic thin film transistor that shows substantially low parasitic capacitance while a capacitor disposed in an array form with respect to the organic thin film transistor has high capacitance, and an organic light-emitting display device including the organic thin film transistor.

2. Description of the Related Technology

Since polyacetylene, which is a conjugated organic polymer having semi-conducting properties, has been developed, research on a transistor using an organic material has been actively conducted in a wide range of applications such as functional electronic devices and optical devices, due to properties of the organic material, that is, various synthesizing methods, easy formation into fabrics and films, flexibility, conductivity, and low manufacturing costs.

A conventional silicon thin film transistor includes a semiconductor layer that includes source and drain areas doped with a high-concentration impurity and a channel area formed between the source area and the drain area, a gate electrode that is insulated from the semiconductor layer and formed in an area corresponding to the channel area, and source and drain electrodes respectively contacting the source and drain areas. However, the conventional silicon thin film transistor as described above is expensive and fragile, and cannot have a plastic substrate due to its high-temperature fabrication process of 300° C. or higher.

Flat panel display devices, such as liquid crystalline display devices and organic light-emitting display devices, use a thin film transistor as a switching device that controls operation of each pixel or a driving device for each pixel.

SUMMARY

The instant disclosure provides a method of preparing an organic thin film transistor in which an organic semiconductor layer and a gate insulating layer are easily formed with precision, capacitance is maintained at a high level and the occurrence of a parasitic capacitance substantially decrease when the organic thin film transistor is realized in an array form with respect to a capacitor, an organic thin film transistor and a flat panel display device including the organic thin film transistor.

One aspect of the invention provides a method of forming an organic thin film transistor, the method comprising: forming source and drain electrodes over a substrate; forming a first insulating layer over the substrate such that the source and drain electrodes are buried under the first insulating layer, the first insulating layer comprising a first surface; hydrophobically treating the first surface so as to make the first surface substantially more hydrophobic than before the treatment; subsequent to treating the first surface, forming an opening in the first insulating layer so as to at least partially expose the source and drain electrodes, wherein the first insulating layer comprises an interior surface within the opening, wherein the first surface is substantially more hydrophobic than the interior surface; forming an organic semiconductor material within the opening such that the organic semiconductor material contacts the source and drain electrodes; and forming a second insulating layer over the organic semiconductor material.

The organic semiconductor material may be hydrophilic. The method may further comprise hydrophilically treating the first surface after forming the second insulating layer so as to make the first surface substantially more hydrophilic than immediately prior to the hydrophilic treatment. Hydrophilically treating the first surface may comprise applying a plasma to the first surface. The second insulating layer may comprise a second surface, and the method may further comprise hydrophilically treating the second surface after forming the second insulating layer so as to make the second surface substantially more hydrophilic than immediately prior to the hydrophilic treatment.

The method may further comprise forming a gate electrode over the second insulating layer. The method may further comprise, before forming the source and drain electrodes: forming a gate electrode over the substrate; and forming a third insulating layer over the substrate such that the gate electrode is buried by the third insulating layer, wherein the source and drain electrodes are formed over the third insulating layer.

The first insulating layer may be formed of a photoresist forming composition. Hydrophobic treating may comprise applying a plasma to the first surface. The plasma may comprise a $CF_4$ plasma or a $C_3F_8$ plasma.

Forming the organic semiconductor material may comprise using an inkjet printing method. The inkjet printing method may comprise filling the organic semiconductor material into the opening. Forming the second insulating layer may comprise using an inkjet printing method. The inkjet printing method may comprise filling an ink composition in the opening such that the second layer is not filled beyond the first insulating layer.

Another aspect of the invention provides an organic thin film transistor comprising: a substrate; source and drain electrodes formed over the substrate; a first insulating layer formed over the substrate, the insulating layer with an opening at least partially exposing the source and drain electrodes, wherein the first insulating layer may comprise a surface, which has a first trace of a first treatment and a second trace of a second treatment during the fabrication of the thin film transistor, wherein the first treatment is to make the surface hydrophilic, wherein the second treatment is to make the surface hydrophilic; an organic semiconductor material formed in the opening and contacting the source and the drain electrodes; and a second insulating layer formed over the organic semiconductor material in the opening.

The surface may comprise at least one of a first trace of the first treatment and a second trace of the second treatment. The organic thin film transistor may further comprise a gate electrode, wherein the second insulating layer is located between the organic semiconductor material and the gate electrode. The organic thin film transistor may further comprise: a third insulating layer formed between the substrate and the source and drain electrodes; and a gate electrode interposed between the third insulating layer and the substrate.

Yet another aspect of the invention provides an organic light-emitting display device comprising: an organic thin film transistor described above; and an organic light-emitting device electrically connected to the organic thin film transistor. The organic light-emitting display device may further comprise a capacitor, wherein the capacitor may comprise a first electrode and a second electrode, the first electrode of the capacitor and the source and drain electrodes of the organic thin film transistor being formed of the same material, and the second electrode of the capacitor being formed on the first insulating layer of the organic thin film transistor.

Another aspect of the invention provides a method of forming an organic thin film transistor, the method comprising: forming source and drain electrodes on a substrate; forming an insulating layer covering the source and drain electrodes; first surface-treating the insulating layer so that the insulating layer has a hydrophobic surface; forming an opening that exposes facing portions of the source and drain electrodes in the first surface-treated insulating layer; forming an organic semiconductor layer and a gate insulating layer in the opening; second surface-treating the first surface-treated insulating layer so that the insulating layer has a hydrophilic surface; and forming a gate electrode overlapping at least a portion of the source and drain electrodes.

Another aspect of the invention provides a method of forming an organic thin film transistor, the method comprising: forming a gate electrode on a substrate; forming a gate insulating layer covering the gate electrode; forming source and drain electrodes on the gate insulating layer; forming a first insulating layer covering the source and drain electrodes; first surface-treating the first insulating layer so that the first insulating layer has a hydrophobic surface; forming an opening that exposes facing portions of the source and drain electrodes in the first surface-treated first insulating layer; forming an organic semiconductor layer and a second insulating layer in the opening; and second surface-treating the first surface-treated first insulating layer and the second insulating layer so that the first insulating layer and the second insulating layer have hydrophilic surfaces.

Yet another aspect of the invention provides an organic thin film transistor comprising: a substrate; source and drain electrodes formed on the substrate; an insulating layer having an opening exposing facing portions of the source and drain electrodes and is subjected to a first surface treatment to have a hydrophobic surface and then subjected to a second surface treatment to change the hydrophobic surface of the insulating layer into a hydrophilic surface; an organic semiconductor layer contacting each of the source and the drain electrodes in the opening of the insulating layer; a gate insulating layer covering the organic semiconductor layer in the opening of the insulating layer; and a gate electrode formed on the gate insulating layer.

Another aspect of the invention provides an organic thin film transistor comprising: a substrate; a gate electrode on the substrate; a gate insulating layer covering the gate electrode; source and drain electrodes on the gate insulating layer; a first insulating layer having an opening exposing facing portions of the source and drain electrodes and is subjected to a first surface treatment to have a hydrophobic surface and then subjected to a second surface treatment to change the hydrophobic surface of the first insulating layer into a hydrophilic surface; and an organic semiconductor layer contacting each of the source and the drain electrodes in the opening of the first insulating layer; and a second insulating layer on the organic semiconductor layer.

Another aspect of the invention provides an organic light-emitting display device comprising: an organic thin film transistor prepared according to one of the method described above; and an organic light-emitting device electrically connected to the organic thin film transistor.

According to the method of preparing an organic thin film transistor as described above, at least one of an organic semiconductor layer and a gate insulating layer can be easily formed. When the organic thin film transistor is formed in an array form with respect to a capacitor, the organic thin film transistor has a substantially low parasitic capacitance while the capacitor has a high capacitance, and an adhesive force between an insulating layer and an electrode can be increased.

BRIEF DESCRIPTION OF THE DRAWINGS

The above and other features and advantages of the instant disclosure will become more apparent by describing in detail exemplary embodiments thereof with reference to the attached drawings in which.

DETAILED DESCRIPTION

The instant disclosure will now be described more fully with reference to the accompanying drawings, in which exemplary embodiments are shown.

Recently, there have been attempts to use a plastic substrate for larger, thinner, and flexible flat panel display devices. However, when the plastic substrate is used, a low temperature process instead of a high temperature process as described above is required. Due to this problem, the silicon thin film transistor cannot be used.

However, when an organic layer is used as the semiconductor layer of the thin film transistor, the above-mentioned problem can be solved. Accordingly, research on an organic thin film transistor using an organic layer as a semiconductor layer has been actively conducted.

Figure 1:
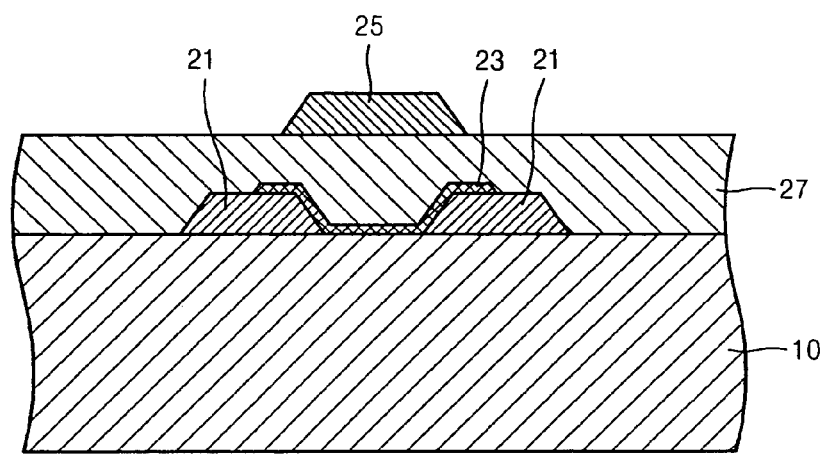
FIG. 1 is a schematic cross-sectional view of an organic thin film transistor.

FIG. 1 is a schematic cross-sectional view of an organic thin film transistor. The organic thin film transistor includes source and drain electrodes 21 formed on a substrate 10, an organic semiconductor layer 23 contacting each of the source and drain electrodes 21, a gate insulating layer 27 that covers the source and drain electrodes 21 and the organic semiconductor layer 23, and a gate electrode 25 formed on the gate insulating layer 27.

Figure 2:
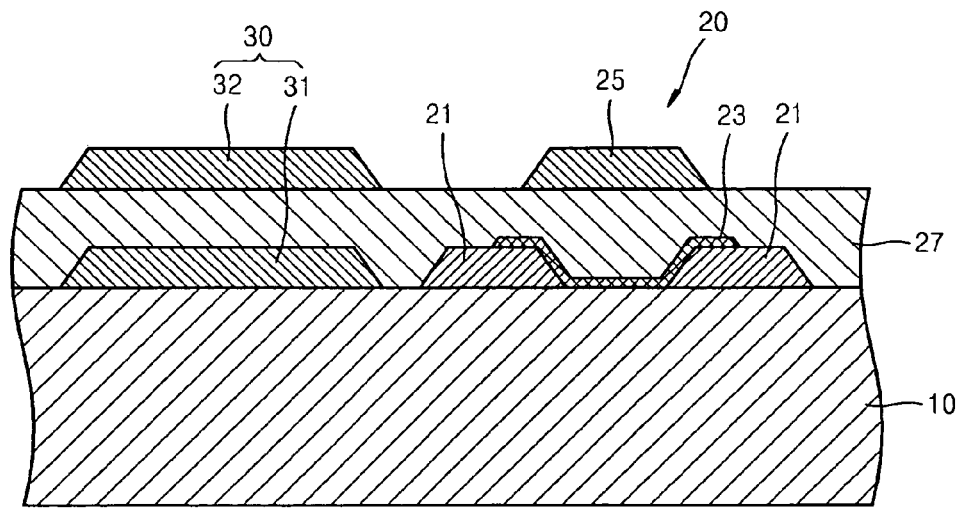
FIG. 2 is a schematic cross-sectional view of an organic thin film transistor disposed in an array form with respect to a capacitor.

When the organic thin film transistor is disposed in an array form with a capacitor, the organic thin film transistor and the capacitor may have a structure as illustrated in FIG. 2. In FIG. 2, a first electrode 31 of a capacitor 30 and the source and drain electrodes 21 of the organic thin film transistor may be formed on the same layer. A second electrode 32 of the capacitor 30 and the gate electrode 25 of the organic thin film transistor may also be formed on the same layer. The gate insulating layer 27 may be interposed between the first electrode 31 and second electrode 32 of the capacitor 30.

In the organic thin film transistor as described above, an edge of the gate electrode 25 overlaps an edge of each of the source and drain electrodes 21 to ensure that a channel formed in the organic semiconductor layer 23 when a predetermined electrical signal is applied to the gate electrode 25 contacts each of the source and drain electrodes 21.

As a material interposed between the first electrode 31 and second electrode 32 of the capacitor 30 has a higher dielectric constant, the capacitor 30 has a greater capacitance and thus the efficiency of the capacitor 30 can be increased. However, in the structure of FIG. 2, the material interposed between the first electrode 31 and second electrode 32 of the capacitor 30 is the gate insulating layer 27, and use of the gate insulating layer 27 having a high dielectric constant may cause an increase in a parasitic capacitance in overlapping areas of the gate electrode 25 and the source and drain electrodes 21 of the organic thin film transistor.

Layers of organic thin film transistors may be formed using printing methods, such as an inkjet printing method, to minimize material loss and to decrease manufacturing costs and time.

In the inkjet printing method, an organic substance or conductive particle that forms a desired layer is mixed with a solvent to prepare an ink composition, and then the prepared ink composition is dropped on a predetermined area. However, when the layer formed of the organic substance or conductive particle is formed by the inkjet printing method, the ink composition may spread beyond a desired area to its surrounding area, and a precise control of pinning point of the ink composition is difficult. Due to these problems, it is difficult to form a layer having a fine pattern.

Figure 3A:
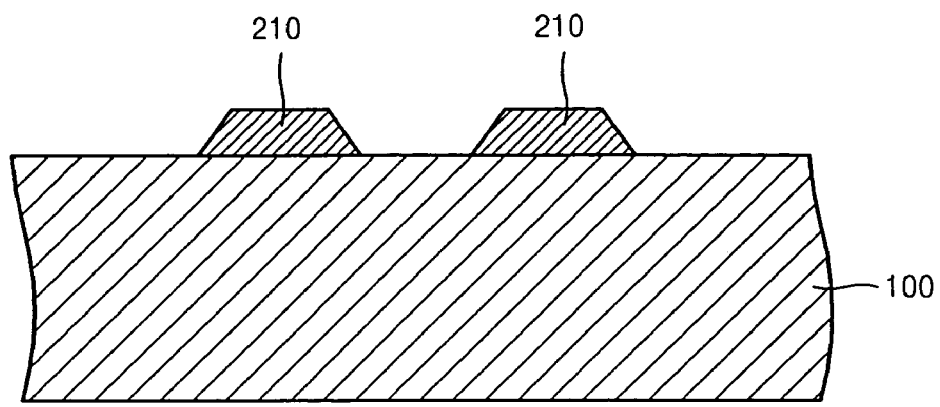
FIG. 3A through FIG. 3F are schematic cross-sectional views illustrating a method of preparing an organic thin film transistor according to one embodiment.

A method of preparing an organic thin film transistor according to one embodiment will now be described in detail with reference to FIGS. 3A through 3F. First, as illustrated in FIG. 3A, source and drain electrodes 210 are formed on a substrate 100.

The substrate 100 can be a glass substrate, a plastic substrate, or a metal substrate. The glass substrate may be formed of silicon oxide or silicon nitrate. The plastic substrate may be formed of an insulating organic material selected from the group consisting of polyethersulphone (PES), polyacrylate (PAR), polyetherimide (PEI), polyethylene napthalate (PEN), polyethyleneterepthalate (PET), polyphenylene sulfide (PPS), polyallylate, polyimide, polycarbonate (PC), cellulose tri acetate (TAC), and cellulose acetate propionate (CAP), bur is not limited thereto. The metal substrate may include at least one metal selected from the group consisting of C, Fe, Cr, Mn, Ni, Ti, Mo, stainless steel (SUS), Invar alloy, ZInconel alloy, and Kovar alloy, but is not limited thereto. The metal substrate can be a metal foil. Among the glass, the plastic, and the metal substrates as described above, the plastic or metal substrate can be used to provide flexibility.

Also, a buffer layer, a barrier layer, or a dispersion prevention layer that prevents dispersion of an impurity atom can be formed on either or both surfaces of the substrate 100. In particular, when the substrate 100 is formed of the metal substrate, an insulating layer (not shown) can be further formed on the substrate 100.

The source and drain electrodes 210 are formed on the substrate 100. The electrodes 210 may be formed of Au, Pd, Pt, Ni, Rh, Ru, Ir, Os, Al or Mo; an alloy of at least two kinds of metals, such as, Al:Nd alloy, or MoW alloy; or a metal oxide, such as ITO, IZO, NiO, $Ag_2O$, $In_2O_3$—$Ag_2O$, $CuAlO_2$, $SrCu_2O_2$, or Zr-doped ZnO. However, the material used to form the source and drain electrodes 210 is not limited thereto. For example, the source and drain electrodes 210 can be formed of at least two substances selected from the metals and metal oxides as described above. The source and drain electrodes 210 can be formed using various methods, such as a depositing method using a mask or a sputtering method.

Figure 3B:
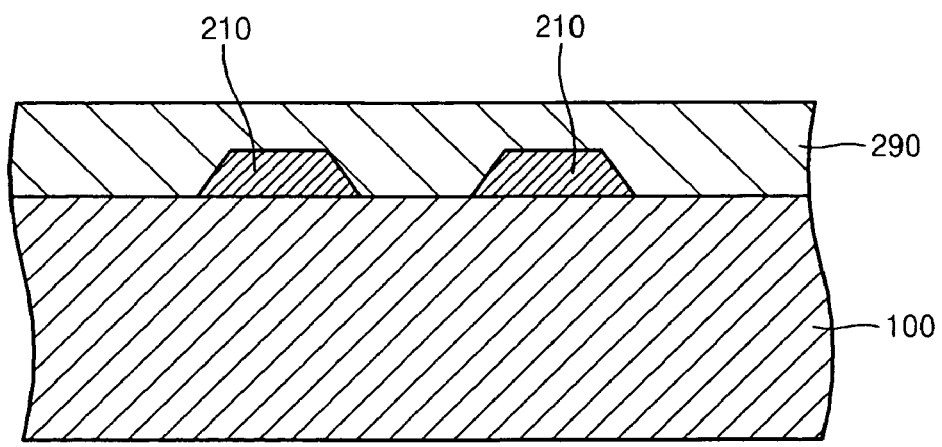

Then, as illustrated in FIG. 3B, the source and drain electrodes 210 are covered by an insulating layer 290. The insulating layer 290 may be formed of an insulating organic material. The insulating layer 290 may include at least one selected from the group consisting of polyvinylpyrrolidone (PVP), polystyrene, styrene-butadiene copolymer, polyvinylphenol, polyphenol, polyacrylate, polymethylmetacrylate (PMMA), polyacrylamide, aliphatic polyamide, aliphatic-aromatic polyamide, aromatic polyamide, polyamideimide, polyimide, polyacetal, polyethyleneglycol, polypropyleneglycol, epoxy resin, polyphenyleneoxide, polyphenylenesulfide, polyvinylalcohol, polyvinylacetate (PVA), polyvinylidene, benzocyclobutene, parylene, cyanocellulose, poly (ether ether) ketone, polyethyleneterephthalate, polybutyleneterephthalate, polydihydroxymethylcyclohexyl terephthalate, cellulose ester, and polycarbonate, but is not limited thereto.

The insulating layer 290 can be formed using any suitable printing and hardening method. For example, the insulating layer 290 can be formed using a photoresist forming composition. More specifically, the insulating layer 290 can be formed by coating a photoresist forming composition on the source and drain electrodes 210 and then performing a hardening process on at least a part of the coated photoresist forming composition using light or heat. Through the hardening process, the photoresist forming composition can be entirely or partly hardened according to a predetermined pattern having an opening.

Figure 3C:
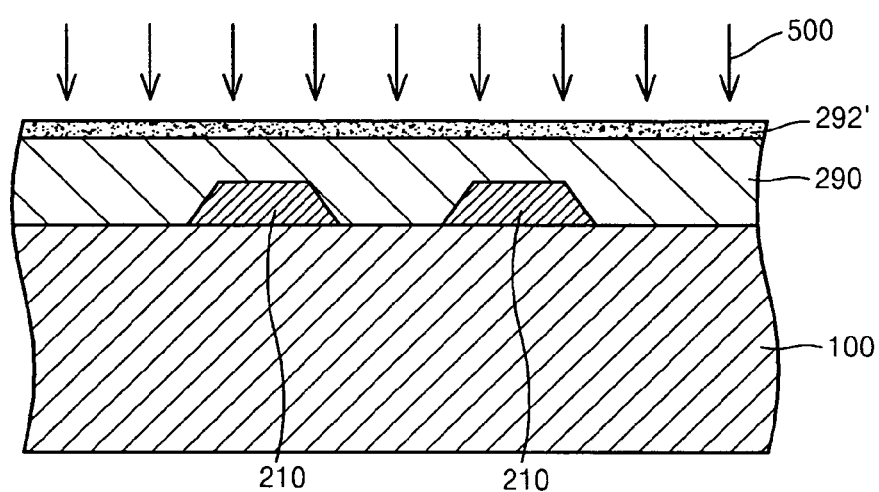

Subsequently, as illustrated in FIG. 3C, a first plasma treatment 500 is performed on the surface of the insulating layer 290 so that the insulating layer 290 has a hydrophobic surface. As a result, a hydrophobic area 292' is formed on an upper portion of the insulating layer 290. The first plasma treatment 500 can be any suitable plasma treatment that can make the surface of the insulating layer 290 hydrophobic. For example, the first plasma treatment 500 can be a plasma treatment that fluoridizes the surface of the insulating layer 290. Accordingly, the first plasma treatment 500 can be a $CF_4$ plasma treatment or a $C_3F_8$ plasma treatment, but is not limited thereto. The first plasma treatment 500 may vary depending on the material forming the insulating layer 290 or the thickness of the insulating layer 290. For example, the first plasma treatment 500 can be performed using RF power or microwaves at a pressure of about 0.001 torr to about 0.1 torr for about 5 to about 600 seconds.

Figure 3D:
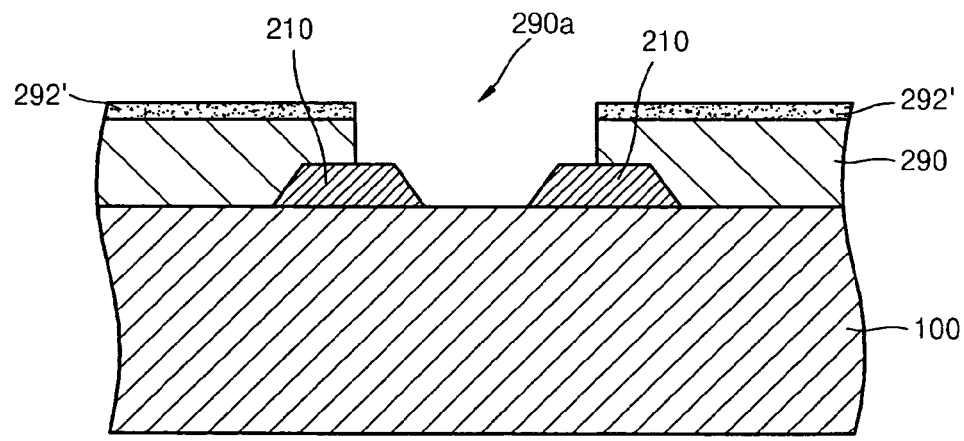

Then, as illustrated in FIG. 3D, an opening 290a exposing portions of the source and drain electrodes 210 is formed in the insulating layer 290. The opening 290a can be formed using various known methods. For example, a laser beam may be irradiated on a portion of the insulating layer 290 so as to form the opening 290a. Alternatively, a photolithographic process may be used to form the opening. For example, during the process of forming the insulating layer 290 and the insulating layer 290 is partially hardened according to a predetermined pattern. Then, only an unhardened part of the insulating layer 290 may be removed to form the opening 290a.

Figure 3E:
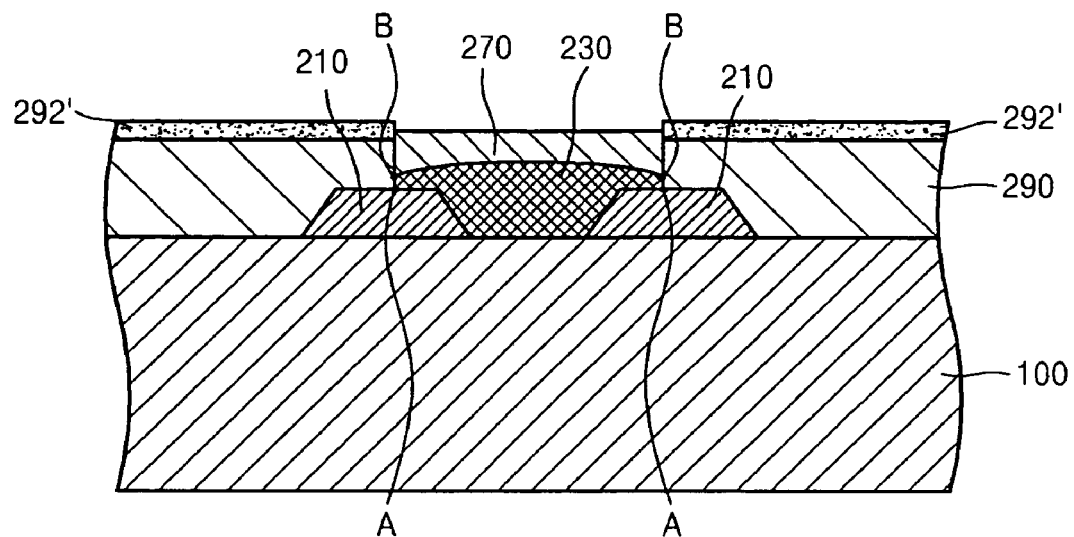

Then, as illustrated in FIG. 3E, an organic semiconductor layer 230 and a gate insulating layer 270 are sequentially formed in the opening 290a. The organic semiconductor layer 230 may be formed of pentacene, tetracene, anthracene, naphthalene, alpha-6-thiophene, alpha-5-thiophene, alpha-4-thiophene, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylenevinylene and a derivative thereof, polyparaphenylene and a derivative thereof, polyflorene and a derivative thereof, polythiophenevinylene and a derivative thereof, polythiopheneheterocyclic aromatic copolymer and a derivative thereof, phthalocyanine that contains or does not contain metal and a derivative thereof, pyromelitic dianhydride and a derivative thereof, pyromelitic diimide and a derivative thereof, or at least two of the foregoing. However, the material used to form the organic semiconductor layer 230 is not limited thereto.

The gate insulating layer 270 may be formed of various materials, such as an inorganic material or an organic material. For example, the gate insulating layer 270 can be formed of an insulating organic material including at least one selected from the group consisting of polyvinylpyrrolidone (PVP), polystyrene, styrene-butadiene copolymer, polyvinylphenol, polyphenol, polyacrylate, polymethylmetacrylate (PMMA), polyacrylamide, aliphatic polyamide, aliphatic-aromatic polyamide, aromatic polyamide, polyamideimide, polyimide, polyacetal, polyethyleneglycol, polypropyleneglycol, epoxy resin, polyphenyleneoxide, polyphenylenesulfide, polyvinylalcohol, polyvinylacetate (PVA), polyvinylidene, benzocyclobutene, parylene, cyanocellulose, poly (ether ether) ketone, polyethyleneterephthalate, polybutyleneterephthalate, polydihydroxymethylcyclohexyl terephthalate, cellulose ester, polycarbonate, polytetrafluoroethylene, tetrafluoroethylene/perfluoro (alkyl vinylether) copolymer, tetrafluoroethylene/hexafluoropropylene copolymer, perfluorophenylene, perfluorobiphenylene, perfluoronaphthanylene, ethylene-tetrafluoroethylene, and poly(vinyllidene fluoride), but is not limited thereto.

At least one of the organic semiconductor layer 230 and the gate insulating layer 270 can be formed of an organic material by any suitable printing method, such as an inkjet printing method. When at least one of the organic semiconductor layer 230 and the gate insulating layer 270 are formed by the inkjet printing method, an organic semi-conducting material or a gate insulating layer forming material is dissolved in a solvent to prepare an ink composition. The ink composition is applied onto a location where the organic semiconductor layer 230 and the gate insulating layer 270 are to be formed. The solvent which is mixed with the organic semi-conducting material and the gate insulating layer forming material is hydrophilic and thus the ink composition is hydrophilic.

As such, only the upper ends of side surfaces of the opening 290a are the hydrophobic area 292' formed as a result of the first plasma treatment making the surface of the insulating layer 290 hydrophobic before the opening 290a is formed. Accordingly, when the hydrophilic ink composition, that is, the ink composition used to form at least one of the organic semiconductor layer 230 and the gate insulating layer 270, is used, the ink composition can be filled from a bottom surface of the opening 290a. That is, a pinning point of the ink composition used to form the organic semiconductor layer 230 is located on a side surface of the opening 290a, for example, Point B of FIG. 3E, not Point A where the side surface of the opening 290a and the source and drain electrodes 210 meet. Therefore, at least a portion of the ink composition contacts the side surface of the opening 290a.

When the pinning point of the ink composition used to form the organic semiconductor layer 230 is Point B of FIG. 3E, the organic semiconductor layer 230 can be sufficiently electrically connected to the source and drain electrodes 210 and thus electrical properties of the device the organic thin film transistor can improve. In addition, the ink composition does not spread beyond the opening 290a or overflows onto the hydrophobic area 292'. As a result, according to the method of preparing an organic thin film transistor according to the current embodiment, the organic semiconductor layer 230 and the gate insulating layer 270 can be precisely formed.

Figure 3F:
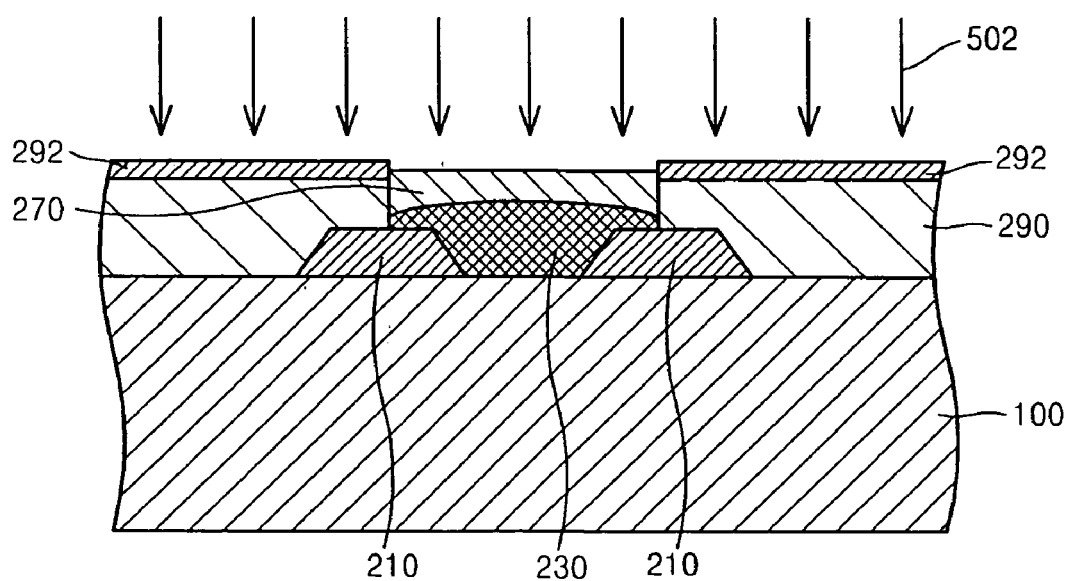

Then, as illustrated in FIG. 3F, a second plasma treatment 502 is performed on the surface of the insulating layer 290 so that the insulating layer 290 has a hydrophilic surface. As a result, a hydrophilic area 292 is formed on an upper portion of the insulating layer 290. Since the second plasma treatment 502 makes the surface of the insulating layer 290 hydrophilic, a conductive layer, such as a gate electrode or a second electrode of capacitor, can be effectively formed on the insulating layer 290.

The second plasma treatment 502 can be any suitable plasma treatment that makes the surface of the insulating layer 290 hydrophilic. For example, the second plasma treatment 502 can be a plasma treatment forming a hydrophilic group, such as a hydroxyl group, on the surface of the insulating layer 290. The second plasma treatment can be an Ar plasma treatment or a hydrogen plasma treatment, but is not limited thereto. In the present embodiment, the second plasma treatment 502 may vary, depending on the material used to form the insulating layer 290 or the thickness of the insulating layer 290. For example, the second plasma treatment 502 can be performed using RF power or microwaves at a pressure of about 0.001 torr to about 0.1 torr for about 5 to about 600 seconds.

Figure 5:
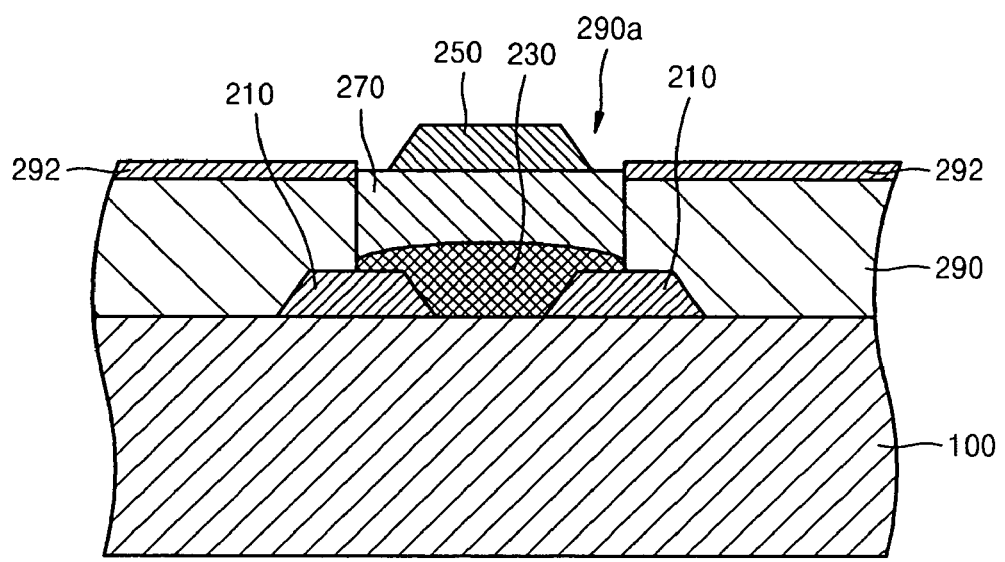
FIGS. 5, 6 and 7 are schematic cross-sectional views of organic thin film transistors according to embodiments.

Then, a gate electrode 250 (see FIG. 5) that corresponds to the source and drain electrodes 210 is formed on the gate insulating layer 270. As a result, an organic thin film transistor as illustrated in FIG. 5 can be obtained. The gate electrode 250 may be formed of a metal, such as Au, Ag, Cu, Ni, Pt, Pd, Al, Mo, Al or Mo; or a metal alloy, such as Al:Nd alloy or Mo:W alloy. However, the material used to form the gate electrode 250 is not limited thereto. The gate electrode 250 can be formed using a depositing method or an inkjet printing method of depositing an ink composition containing a conductive particle, such as metal.

FIG. 4A through FIG. 4H are schematic cross-sectional views illustrating a method of preparing an organic thin film transistor according to another embodiment of the organic thin film transistor.

Figure 4A:
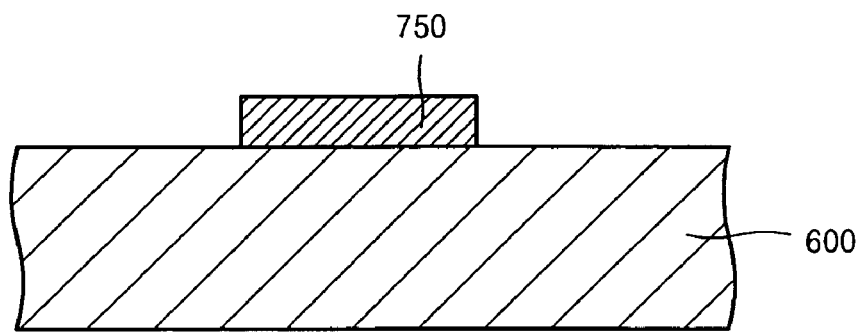
FIG. 4A through FIG. 4H are schematic cross-sectional views illustrating a method of preparing an organic thin film transistor according to another embodiment.
Figure 4B:
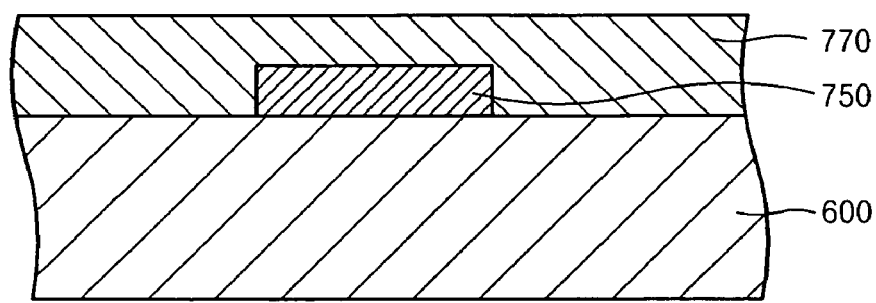
Figure 4C:
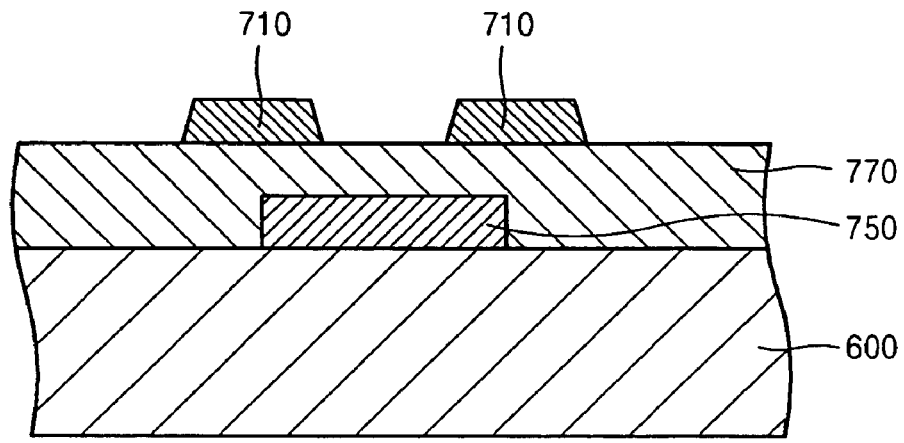
Figure 4D:
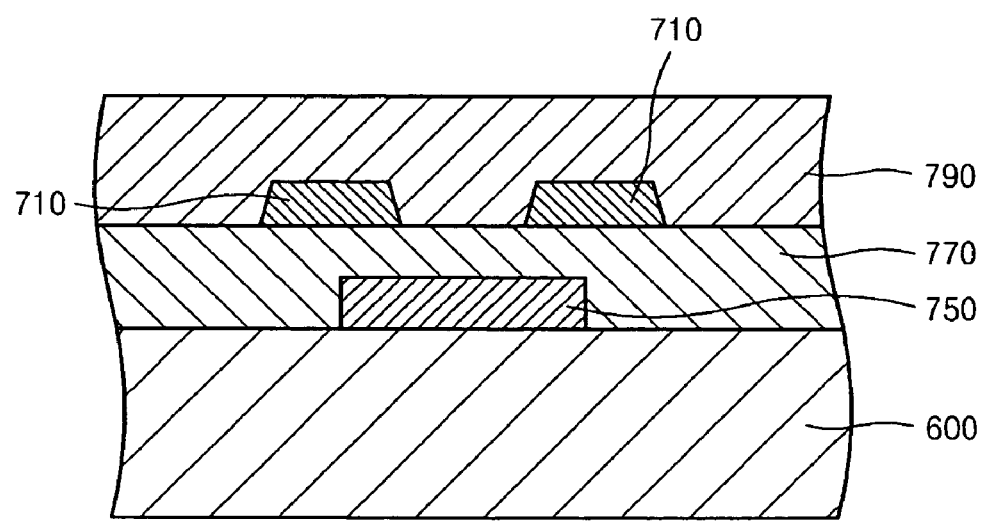

First, as illustrated in FIG. 4A, a gate electrode 750 is formed on a substrate 600. Then, as illustrated in FIG. 4B, a gate insulating layer 770 that covers the gate electrode 750 is formed. Subsequently, as illustrated in FIG. 4C, source and drain electrodes 710 is formed on the gate insulating layer 770 such that portions of the electrodes 710 overlap with the gate electrode 750. Then, as illustrated in FIG. 4D, a first insulating layer 790 that covers the source and drain electrodes 710 is formed. The configurations and materials of the substrate 600, the gate electrode 750, the gate insulating layer 770 and the source and drain electrodes 710 can be as described above.

The first insulating layer 790 may be formed of an insulating organic material including at least one selected from the group consisting of polyvinylpyrrolidone (PVP), polystyrene, styrene-butadiene copolymer, polyvinylphenol, polyphenol, polyacrylate, polymethylmetacrylate (PMMA), polyacrylamide, aliphatic polyamide, aliphatic-aromatic polyamide, aromatic polyamide, polyamideimide, polyimide, polyacetal, polyethyleneglycol, polypropyleneglycol, epoxy resin, polyphenyleneoxide, polyphenylenesulfide, polyvinylalcohol, polyvinylacetate (PVA), polyvinylidene, benzocyclobutene, parylene, cyanocellulose, poly (ether ether) ketone, polyethyleneterephthalate, polybutyleneterephthalate, polydihydroxymethylcyclohexyl terephthalate, cellulose ester, and polycarbonate, but is not limited thereto.

The first insulating layer 790 can be formed using any suitable printing method and/or hardening method. For example, the first insulating layer 790 can be formed using a photoresist forming composition. More specifically, the photoresist forming composition is coated on the source and drain electrodes 710. Then, a hardening process is selectively performed using light or heat. Through the hardening process, the photoresist forming composition can be entirely or partly hardened according to a predetermined pattern having an opening.

Figure 4E:
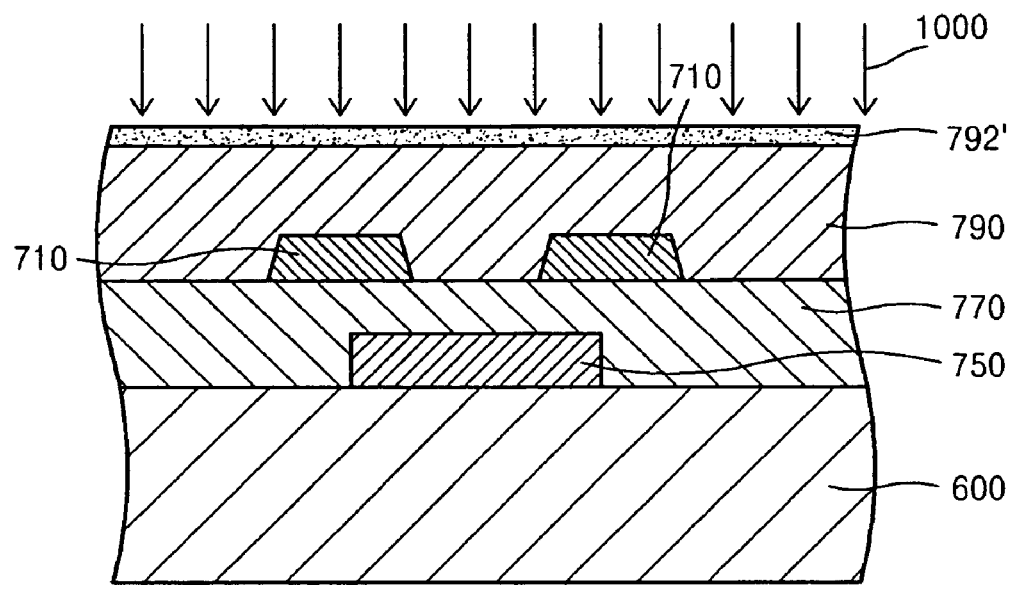

Then, as illustrated in FIG. 4E, a first plasma treatment 1000 is performed on the surface of the first insulating layer 790 so that the first insulating layer 790 has a hydrophobic surface. As a result, a hydrophobic area 792' is formed on an upper portion of the first insulating layer 790. The first plasma treatment 1000 can be any suitable plasma treatment that makes the surface of the first insulating layer 790 hydrophobic. For example, the first plasma treatment 1000 can be a plasma treatment that fluoridizes the surface of the first insulating layer 790. Accordingly, the first plasma treatment 1000 can be a $CF_4$ plasma treatment or a $C_3F_8$ plasma treatment, but is not limited thereto. In the present embodiment, the first plasma treatment 1000 may vary, depending on the material used to form the first insulating layer 790 or the thickness of the first insulating layer 790. For example, the first plasma treatment 1000 can be performed using RF power or microwaves at a pressure of about 0.001 torr to about 0.1 torr for about 5 to about 600 seconds.

Figure 4F:
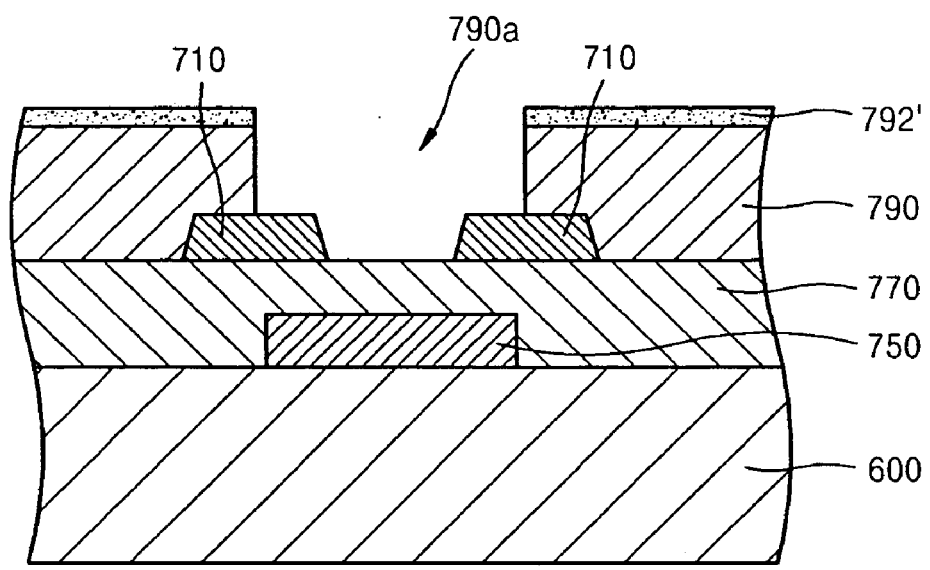

Then, as illustrated in FIG. 4F, an opening 790a exposing parts of source and drain electrodes 710 is formed in the first insulating layer 790. The opening 790a can be formed using any suitable methods. For example, a laser beam is irradiated to a portion of the first insulating layer 790 so that the opening 790a is formed in the first insulating layer 790. Alternatively, during the process of forming the first insulating layer 790, when the first insulating layer 790 is partly hardened according to a predetermined pattern, only an unhardened part of the first insulating layer 790 can be removed to form the opening 790a.

Figure 4G:
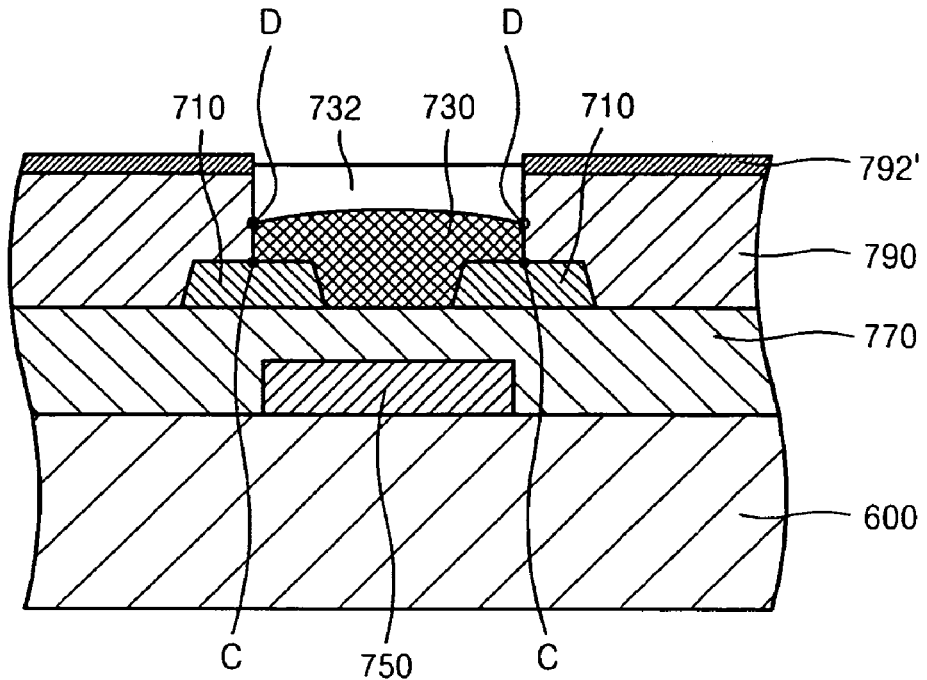

Then, as illustrated in FIG. 4G, an organic semiconductor layer 730 and a second insulating layer 732 are sequentially formed in the opening 790a. A material used to form the organic semiconductor layer 730 is as described above. A material used to form the second insulating layer 732 can be the same as the material used to form the first insulating layer 790, but is not limited thereto.

At least one of the organic semiconductor layer 730 and the second insulating layer 732 can be formed by any suitable printing method, such as an inkjet printing method. When at least one of the organic semiconductor layer 730 and the second insulating layer 732 are formed by the inkjet printing method, an organic semi-conducting material or a second insulating layer forming material is dissolved in a solvent to prepare an ink composition. The ink composition is applied onto a location where at least one of the organic semiconductor layer 730 and the second insulating layer 732 is to be formed. The solvent that is mixed with the organic semi-conducting material and the second insulating layer forming material is hydrophilic and thus the ink composition is also hydrophilic.

As such, only upper ends of side surfaces of the opening 790a are the hydrophobic area 792' that is formed as a result of the first plasma treatment. Accordingly, when the hydrophilic ink composition, that is, the ink composition used to form at least one of the organic semiconductor layer 730 and the second insulating layer 732, is used, the ink composition can be filled from a bottom surface of the opening 790a. That is, a pinning point of the ink composition used to form the organic semiconductor layer 730 is located on a side surface of the opening 790a, for example, Point D of FIG. 4G, not Point C where the side surface of the opening 290a and the source and drain electrodes 210 meet. Therefore, at least a portion of the ink composition contacts the side surface of the opening 290a.

In addition, the ink composition used to form the second insulating layer 732 can be filled up to the upper ends of the side surfaces of the opening 790a of the first insulating layer 790. As a result, the opening 790a can be completely filled with the ink composition used to form the organic thin film transistor 730 and the second insulating layer 732. In addition, the ink composition used to form the second insulating layer 732 does not spread beyond the first insulating layer 790 or overflows onto the hydrophobic area 792'. As a result, according to the method of preparing an organic thin film transistor of the current embodiment, the organic semiconductor layer 730 and the second insulating layer 732 can be precisely formed.

Figure 4H:
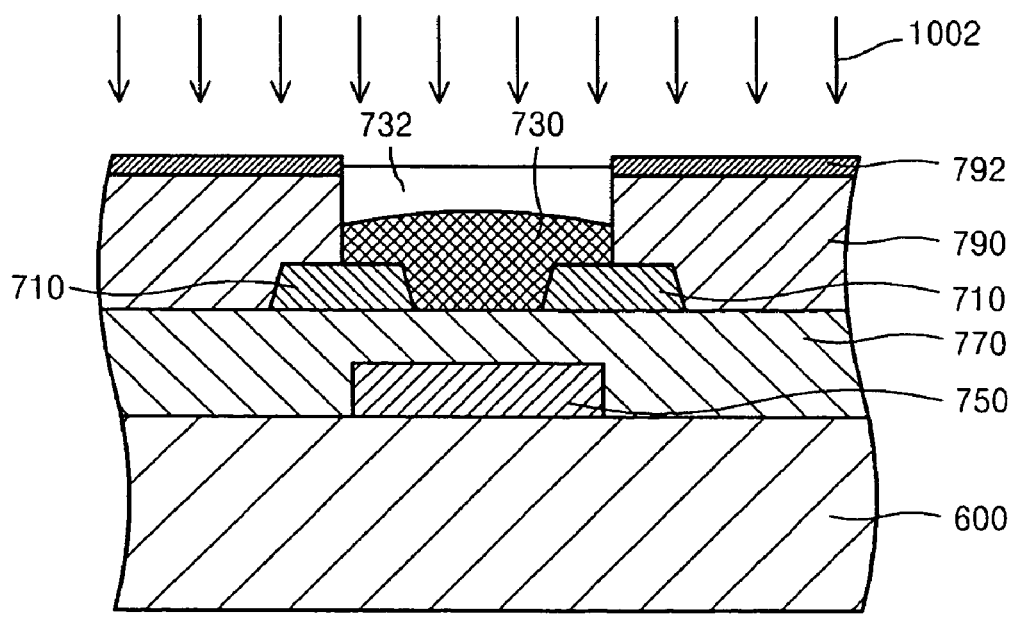

Then, as illustrated in FIG. 4H, a second plasma treatment 1002 is performed on the surface of the first insulating layer 790 so that the first insulating layer 790 has a hydrophilic surface. As a result, a hydrophilic area 792 is formed on an upper portion of the first insulating layer 790. Since the second plasma treatment 1002 makes the surface of the first insulating layer 790 hydrophilic, a conductive layer, such as a second electrode of a capacitor, can be effectively formed on the first insulating layer 790.

The second plasma treatment 1002 can be any suitable plasma treatment that makes the surface of the first insulating layer 790 hydrophilic. For example, the second plasma treatment 1002 can be a plasma treatment forming a hydrophilic group, such as a hydroxyl group, at the surface of the first insulating layer 790. The second plasma treatment can be an Ar plasma treatment or a hydrogen plasma treatment, but is not limited thereto. In the present embodiment, the second plasma treatment 1002 may vary depending on the material used to form the first insulating layer 790 or the thickness of the first insulating layer 790. For example, the second plasma treatment 1002 can be performed using RF power or microwaves at a pressure of about 0.001 torr to about 0.1 torr for about 5 to about 600 seconds.

As such, an organic thin film transistor according to an embodiment includes a substrate, source and drain electrodes formed on the substrate, an insulating layer having an opening exposing portions of the source and drain electrodes. The insulating layer is subjected to a first surface treatment in order to have a hydrophobic surface and then is subjected to a second surface treatment to change the hydrophobic surface into a hydrophilic surface. An organic semiconductor layer is formed in the opening of the insulating layer to contact each of the source and drain electrodes. A gate insulating layer is formed in the opening to cover the organic semiconductor layer. A gate electrode is formed on the gate insulating layer.

Figure 6:
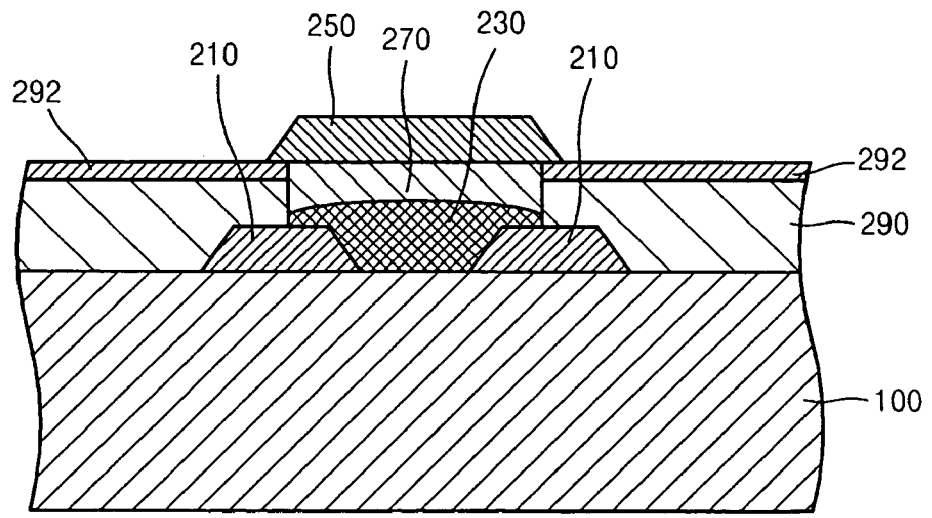
Figure 7:
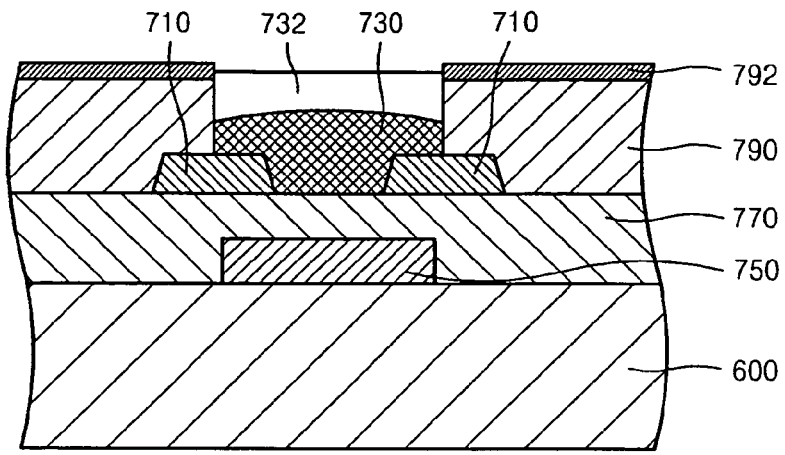

FIGS. 5, 6 and 7 are schematic cross-sectional views of organic thin film transistors according to embodiments. Referring to FIG. 5, source and drain electrodes 210 are formed on a substrate 100. An organic semiconductor layer 230 contacting the source and drain electrodes 210 is formed. A gate electrode 250 is formed on the organic semiconductor layer 230. A gate insulating layer 270 is interposed between the organic semiconductor layer 230 and the gate electrode 250 to insulate the gate electrode 250 from the source and drain electrodes 210 and the organic semiconductor layer 230. In the present embodiment, an insulating layer 290 having an opening 290a that exposes portions of the source and drain electrodes 210 is formed on the substrate 100. The insulating layer 290 is subjected to a first surface treatment to have a hydrophobic surface, and then is subjected to a second surface treatment in order to change the hydrophobic surface of the insulating layer 290 into a hydrophilic surface. As a result, the insulating layer 290 has a hydrophilic area 292. The organic semiconductor layer 230, the gate insulating layer 270, and the gate electrode 250 are formed in the opening 290a of the insulating layer 290, and the organic semiconductor layer 230 and the gate insulating layer 270 can be formed with precision as described above. The organic thin film transistor according to the current embodiment can be prepared according to the method of preparing an organic thin film transistor as described above.

However, the organic thin film transistor according to an embodiment is not limited thereto. For example, as illustrated in FIG. 6, at least a portion of a lower surface of the gate electrode 250 of the organic thin film transistor can contact an upper surface of the hydrophilic area 292 of the insulating layer 290.

An organic thin film transistor according to another embodiment will now be descried in detail with reference to FIG. 7. Referring to FIG. 7, a gate electrode 750 is formed on a substrate 600. A gate insulating layer 770 is formed to cover the gate electrode 750. Source and drain electrodes 710 are formed on the gate insulating layer 770 so as to partially overlap with the gate electrode 750. An organic semiconductor layer 730 is electrically connected to the source and drain electrodes 710. A first insulating layer 790 has an opening exposing portions of the source and drain electrodes 710. The first insulating layer 790 is subjected to a first surface treatment in order to have a hydrophobic surface, and then is subjected to a second surface treatment in order to change the hydrophobic surface of the first insulating layer 790 into a hydrophilic surface. As a result, the first insulating layer 790 has a hydrophilic area 792. The organic semiconductor layer 730 and a second insulating layer 732 are formed in the opening of the first insulating layer 790. Thus, the organic semiconductor layer 730 and the second insulating layer 732 can be formed with precision as described above. The organic thin film transistor according to the current embodiment can be prepared according to a method of preparing an organic thin film transistor as described above. The configurations of the layers illustrated in FIGS. 5, 6, and 7 can be as described above.

Figure 8:
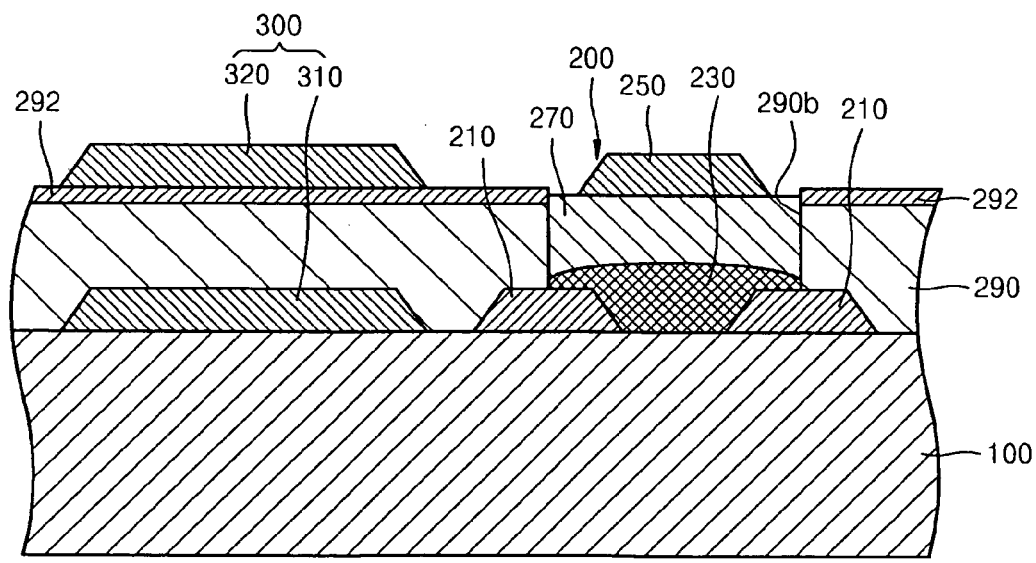
FIGS. 8, 9 and 10 are schematic cross-sectional views of the organic thin film transistors illustrated in FIGS. 5, 6 and 7 disposed in an array form with respect to a capacitor, respectively.

FIG. 8 is a schematic cross-sectional view of the organic thin film transistor 200 of FIG. 5 formed in an array form with a capacitor 300, according to an embodiment. Referring to FIG. 8, the organic thin film transistor 200 and the capacitor 300 are formed in an array form. However, the structure of the organic thin film transistor 200 and the capacitor 300 is not limited thereto. That is, although the organic thin film transistor 200 is insulated from the capacitor 300 as illustrated in FIG. 8, the first electrode 310 or second electrode 320 of the capacitor 300 can be electrically connected to one of the source and drain electrodes 210 or the gate electrode 250 of the organic thin film transistor 200.

In the present embodiment, the first electrode 310 of the capacitor 300 and the source and drain electrodes 210 of the organic thin film transistor 200 are formed on the same layer. The second electrode 320 of the capacitor 300 is formed in the hydrophilic area 292 of the insulating layer 290 of the organic thin film transistor 200. In the present embodiment, in order to increase the capacitance of the capacitor 300, the insulating layer 290 interposed between first and second electrodes 310 and 320 of the capacitor 300 may have a high dielectric constant.

As such, in order to decrease a parasitic capacitance of the organic thin film transistor, an insulating layer interposed between source and drain electrodes and a gate electrode may have a low dielectric constant. By comparison, in the array structure of FIG. 2, in which the gate insulating layer 27 interposed between the electrodes 31 and 32 of the capacitor 30 is also the gate insulating layer 27 of the organic thin film transistor 20, it is impossible to increase the capacitance of the capacitor 30 even if the parasitic capacitance of the organic thin film transistor 20 decreases.

However, in the array according to an embodiment, as illustrated in FIG. 8, the insulating layer 290 interposed between the first and second electrodes 310 and 320 of the capacitor 300 and the gate insulating layer 270 interposed between the source and drain electrodes 210 and gate electrode 250 of the organic thin film transistor 200 can be formed of different materials. Thus, the dielectric constant of the gate insulating layer 270 can be adjusted to be lower than the dielectric constant of the insulating layer 290 interposed between the first and second electrodes 310 and 320 of the capacitor 300. As a result, even if the capacitor 300 has a high capacitance, the organic thin film transistor 200 can substantially have a low parasitic capacitance.

Figure 9:
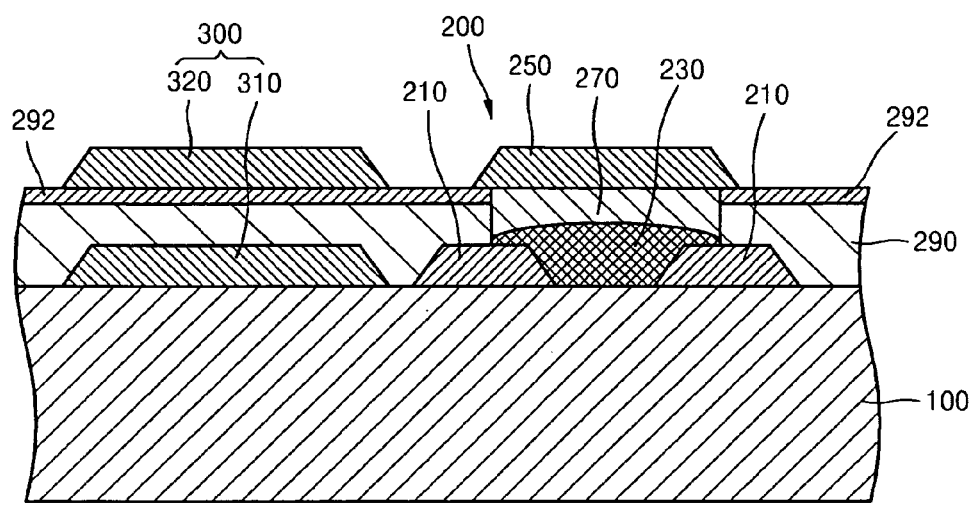

FIG. 9 is a schematic cross-sectional view of the organic thin film transistor of FIG. 6 formed in an array form with the capacitor 300, according to an embodiment. Referring to FIG. 9, the gate electrode 250 of the organic thin film transistor 200 and the second electrode 320 of the capacitor 300 are formed on the same layer.

Figure 10:
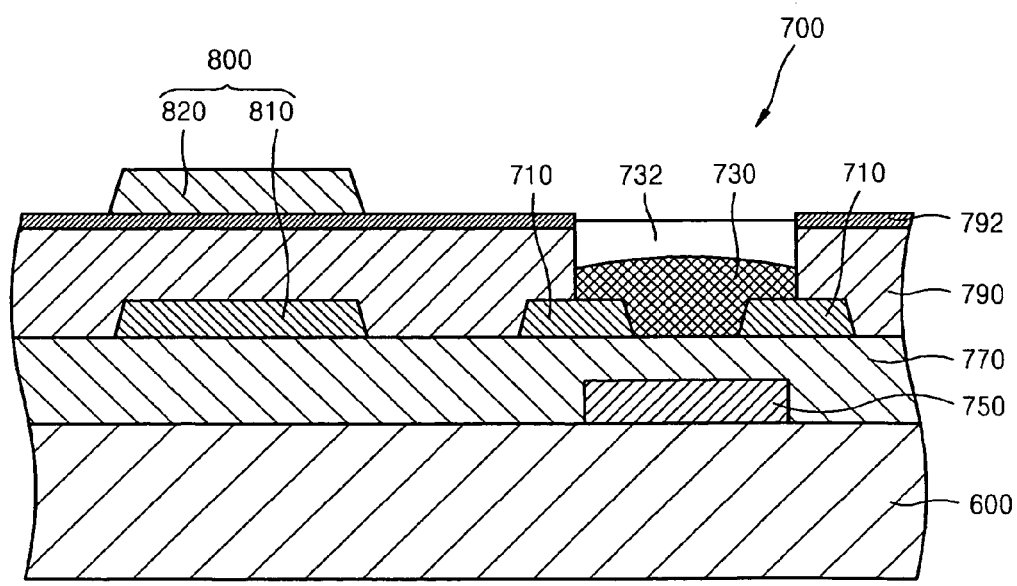

FIG. 10 is a schematic cross-sectional view of the organic thin film transistor of FIG. 7 formed in an array form with a capacitor 800, according to an embodiment. Referring to FIG. 10, a first electrode 810 of the capacitor 800 and the source and drain electrodes 710 of the organic thin film transistor 700 are formed on the same layer. A second electrode 820 of the capacitor 800 is formed in the hydrophilic area 792 of the first insulating layer 790 of the organic thin film transistor. In the present embodiment, in order to increase the capacitance of the capacitor 800, the first insulating layer 790 interposed between the first and second electrodes 810 and 820 of the capacitor 800 may have a high dielectric constant.

Figure 11:
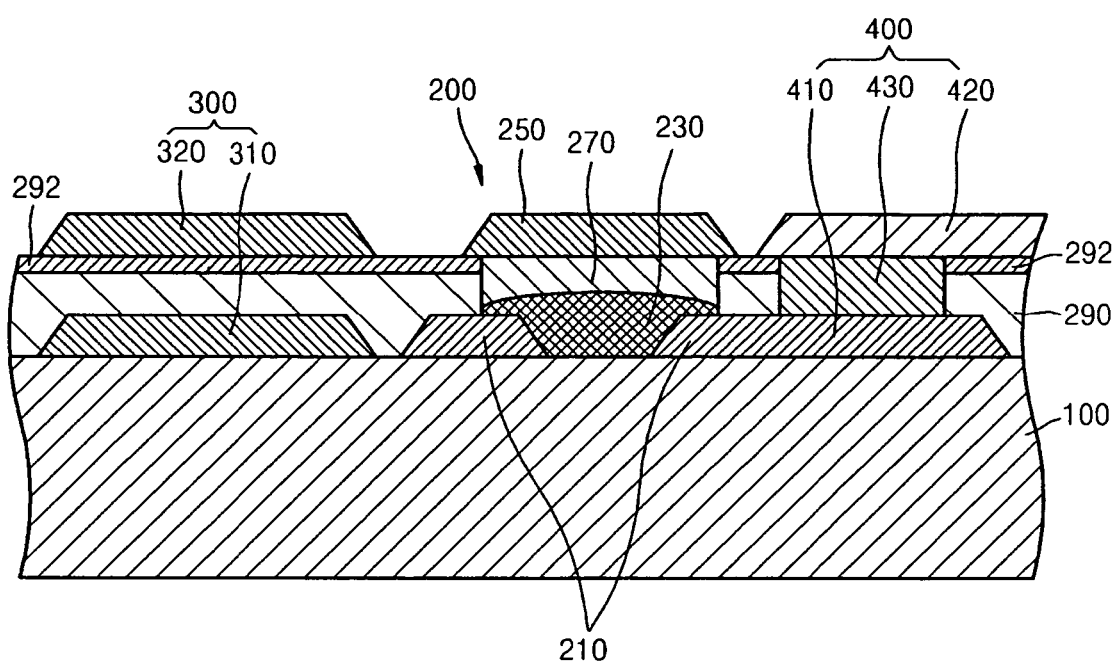
FIG. 11 is a schematic cross-sectional view of an organic light-emitting display device according to an embodiment.

FIG. 11 is a schematic cross-sectional view of an organic light-emitting display device according to an embodiment. The organic thin film transistors as described above are very flexible so that the organic thin film transistors can be used in various flexible flat panel display devices including a thin film transistor, such as a liquid crystalline display device or an organic light-emitting display device.

Hereinafter, the organic light-emitting display device including the organic thin film transistors described above will be described in detail with reference to FIG. 11. In organic light-emitting display devices including the organic thin film transistors according to embodiments described above, an organic thin film transistor and a light emitting device are formed on a substrate 100.

An organic light-emitting display device can have various forms, and the organic light-emitting display device including an organic thin film transistor according to an embodiment is an active matrix (AM) light-emitting display device.

As illustrated in the organic light-emitting display device of FIG. 11, each sub-pixel includes at least one organic thin film transistor 200. Referring to FIG. 11, a buffer layer (not shown) may be formed of, for example, $SiO_2$ on the substrate 100. The organic thin film transistor as described above can be formed on the substrate 100. The organic thin film transistor 200 illustrated in FIG. 11 can be any one of the organic thin film transistors according to embodiments, but is not limited thereto.

In the organic light-emitting display device according to the current embodiment, one of the source and drain electrodes 210 of an organic thin film transistor 200 and a pixel electrode 410 of an organic light-emitting device 400 are formed integrally on the same layer. However, the structure of the organic light-emitting display device is not limited thereto. For example, a passivation layer formed of $SiO_2$ can be formed on the organic thin film transistor 200. A pixel definition layer formed of acryl or polyimide including an opening may be formed on the passivation layer. An organic light-emitting device is formed in the opening. The organic light-emitting device 400 includes a pixel electrode 410 and a facing electrode 420 facing each other, and an intermediate layer 430 interposed between the pixel electrode 410 and the facing electrode 420. The intermediate layer 430 includes at least an emission layer. However, the structure of the organic light-emitting device 400 is not limited thereto.

Although in FIG. 11 the intermediate layer 430 of the organic light-emitting device 400 is formed for a single sub-pixel, the configuration thereof is not limited thereto. For example, the intermediate layer 430 can be formed integrally with an intermediate layer of an adjacent sub-pixel. In addition, the intermediate layer 430 can have a layer formed for a single sub-pixel and another layer formed integrally with an intermediate layer of an adjacent sub-pixel.

The pixel electrode 410 acts as an anode, and the facing electrode 420 acts as a cathode. Alternatively, the pixel electrode 410 may act as a cathode and the facing electrode 420 may act as an anode.

The pixel electrode 410 can be formed integrally with one of the source and drain electrodes 210 of the organic thin film transistor 200, as described above. In the present embodiment, the pixel electrode 410 can be a transparent electrode or a reflective electrode. The transparent electrode can be formed of ITO, IZO, ZnO, or $In_2O_3$. The reflective electrode can be formed by forming a reflective film formed of Ag, Mg, Al, Pt, Pd, Au, Ni, Nd, Ir, Cr, or a combination thereof and forming a layer of ITO, IZO, ZnO, or $In_2O_3$ on the reflective film.

The facing electrode 420 can be a transparent electrode or a reflective electrode. The transparent electrode can be formed by depositing Li, Ca, LiF/Ca, LiF/Al, Al, Mg or a compound thereof in a direction of the intermediate layer 430 and then forming an auxiliary electrode or a bus electrode line formed of a transparent conductive material, such as ITO, IZO, ZnO, or $In_2O_3$. The reflective electrode may be formed by depositing at least one of Li, Ca, LiF/Ca, LiF/Al, Al, Mg, or a combination thereof over substantially the entire surface of the substrate 100.

The intermediate layer 430 interposed between the pixel electrode 410 and the facing electrode 420 can be formed of a low molecular weight organic material or a high molecular weight organic material. When the intermediate layer 430 is formed of a low molecular weight organic material, the intermediate layer 430 may have a single-layer or multi-layers structure having at least one of a hole injection layer (HIL), a hole transport layer (HTL), an organic emission layer (EML), an electron transport layer (ETL), an electron injection layer (EIL), and the like. The low molecular weight organic material can be copper phthalocyanine (CuPc), N,N'-Di(naphthalene-1-yl)-N,N'-diphenyl-benzidine (NPB), or tris-8-hydroxyquinoline aluminum (Alq3). When the intermediate layer 430 is formed of a high molecular weight organic material, the intermediate layer 430 may include a HTL and an EML. In the present embodiment, the HTL may be formed of PEDOT. The EML may be formed of a poly-phenylenevinylene (PPV)-based organic material or a polyfluorene-based organic material.

The organic light-emitting device 400 formed on the substrate 100 is encapsulated by a facing member (not shown). The facing member can be formed of the material used to form the substrate 100, such as glass or plastic, or can be a metal cap.

The organic light-emitting display devices including organic thin film transistors according to embodiments can produce images with precision according to input image signals. The current embodiment is described using the organic light-emitting display device. However, the embodiments described above can be used in any display device that can include an organic thin film transistor.

According to the method of preparing an organic thin film transistor as described above, at least one of an organic semiconductor layer and a gate insulating layer can be effectively formed using a printing method, such as an inkjet printing method, so that mass production can be realized at low costs. An organic thin film transistor according to the embodiments described above has a substantially low parasitic capacitance. A capacitor formed in an array form with the organic thin film transistor has a high capacitance. As a result, a flat panel display device including the organic thin film transistor shows excellent electrical properties.

While the instant disclosure has been particularly shown and described with reference to exemplary embodiments thereof, it will be understood by one of ordinary skill in the art that various changes in form and details may be made therein without departing from the spirit and scope of the instant disclosure as defined by the following claims.

What is claimed is:

1. A method of forming an organic thin film transistor, the method comprising:
    forming source and drain electrodes over a substrate;
    forming a first insulating layer over the substrate such that the source and drain electrodes are buried under the first insulating layer, the first insulating layer comprising a first surface;
    hydrophobically treating the first surface so as to make the first surface substantially more hydrophobic than before the treatment;
    subsequent to treating the first surface, forming an opening in the first insulating layer so as to at least partially expose the source and drain electrodes, wherein the first insulating layer comprises an interior surface within the opening, wherein the first surface is substantially more hydrophobic than the interior surface;

forming an organic semiconductor material within the opening such that the organic semiconductor material contacts the source and drain electrodes;

forming a second insulating layer over the organic semiconductor material; and hydrophilically treating the first surface after forming the second insulating layer so as to make the first surface substantially more hydrophilic than immediately prior to the hydrophilic treatment.

2. The method of claim 1, wherein hydrophilically treating the first surface comprises applying a plasma to the first surface.

3. The method of claim 1, further comprising forming a gate electrode over the second insulating layer.

4. The method of claim 1, further comprising, before forming the source and drain electrodes:

forming a gate electrode over the substrate; and forming a third insulating layer over the substrate such that the gate electrode is buried by the third insulating layer, wherein the source and drain electrodes are formed over the third insulating layer.

5. The method of claim 1, wherein the first insulating layer is formed of a photoresist forming composition.

6. The method of claim 1, wherein hydrophobic treating comprises applying a plasma to the first surface.

7. The method of claim 1, wherein forming the organic semiconductor material comprises using an inkjet printing method.

8. The method of claim 1 wherein forming the second insulating layer comprises using an inkjet printing method.

9. The method of claim 1, wherein the organic semiconductor material is hydrophilic.

10. The method of claim 1, wherein the second insulating layer comprises a second surface, and wherein the method further comprises hydrophilically treating the second surface after forming the second insulating layer so as to make the second surface substantially more hydrophilic than immediately prior to the hydrophilic treatment.

11. The method of claim 6, wherein the plasma comprises a $CF_4$ plasma or a $C_3F_8$ plasma.

12. The method of claim 7, wherein the inkjet printing method comprises filling the organic semiconductor material into the opening.

13. The method of claim 8, wherein the inkjet printing method comprises filling an ink composition in the opening such that the second layer is not filled beyond the first insulating layer.

14. A method of forming an organic thin film transistor, the method comprising:

forming source and drain electrodes over a substrate;

forming a first insulating layer over the substrate such that the source and drain electrodes are buried under the first insulating layer, the first insulating layer comprising a first surface;

hydrophobically treating the first surface so as to make the first surface substantially more hydrophobic than before the treatment;

subsequent to treating the first surface, forming an opening in the first insulating layer through the hydrophobically treated first surface so as to align a boundary of the opening with a cut-out portion of the hydrophobically treated first surface, wherein the opening at least partially exposes the source and drain electrodes, wherein the first insulating layer comprises an interior surface within the opening, wherein the first surface is substantially more hydrophobic than the interior surface;

forming an organic semiconductor material within the opening such that the organic semiconductor material contacts the source and drain electrodes; and forming a second insulating layer over the organic semiconductor material, wherein the second insulating layer comprises a second surface, and wherein the method further comprises hydrophilically treating the second surface after forming the second insulating layer so as to make the second surface substantially more hydrophilic than immediately prior to the hydrophilic treatment.

15. The method of claim 14, wherein the organic semiconductor material is hydrophilic.

16. The method of claim 14, wherein the first insulating layer is formed of a photoresist forming composition.

17. The method of claim 14, wherein hydrophobic treating comprises applying a plasma to the first surface.

18. The method of claim 14, wherein forming the organic semiconductor material comprises using an inkjet printing method.

19. The method of claim 14, wherein forming the second insulating layer comprises using an inkjet printing method.

20. The method of claim 17, wherein the plasma comprises a $CF_4$ plasma or a $C_3F_8$ plasma.

* * * * *